(12) United States Patent
Dong et al.

(10) Patent No.: US 12,095,011 B2
(45) Date of Patent: Sep. 17, 2024

(54) DISPLAY SUBSTRATE, SPLICED DISPLAY PANEL AND DISPLAY APPARATUS

(71) Applicants: BOE MLED Technology Co., Ltd., Beijing (CN); BOE Technology Group Co., Ltd., Beijing (CN)

(72) Inventors: Enkai Dong, Beijing (CN); Haiwei Sun, Beijing (CN); Pei Li, Beijing (CN); Ming Zhai, Beijing (CN); Jian Sang, Beijing (CN); Lu Yu, Beijing (CN); Chao Liu, Beijing (CN)

(73) Assignees: BOE MELD Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 435 days.

(21) Appl. No.: 17/434,712

(22) PCT Filed: Jan. 4, 2021

(86) PCT No.: PCT/CN2021/070170
§ 371 (c)(1),
(2) Date: Aug. 27, 2021

(87) PCT Pub. No.: WO2021/139626
PCT Pub. Date: Jul. 15, 2021

(65) Prior Publication Data
US 2022/0199865 A1 Jun. 23, 2022

(30) Foreign Application Priority Data
Jan. 6, 2020 (CN) .......................... 202020021403.5

(51) Int. Cl.
*H01L 33/46* (2010.01)
*H01L 25/075* (2006.01)
(Continued)

(52) U.S. Cl.
CPC .......... *H01L 33/46* (2013.01); *H01L 25/0753* (2013.01); *H01L 33/56* (2013.01); *H01L 33/58* (2013.01); *H01L 33/62* (2013.01)

(58) Field of Classification Search
CPC ..... H01L 33/46; H01L 25/0753; H01L 33/56; H01L 33/58; H01L 33/62; H01L 2933/0066; H01L 27/12; G09F 9/33
See application file for complete search history.

(56) References Cited

U.S. PATENT DOCUMENTS 10,483,253 B1 * 11/2019 Hu .......................... H01L 25/50
2006/0157724 A1 * 7/2006 Fujita ...................... B29C 39/10
257/E33.059
(Continued)

FOREIGN PATENT DOCUMENTS

CN  1812093 A   8/2006
CN  102044610 A  5/2011
(Continued)

*Primary Examiner* — Herve-Louis Y Assouman
(74) *Attorney, Agent, or Firm* — IPro, PLLC (57) ABSTRACT

A display substrate includes a base substrate, a plurality of light-emitting units, a protecting layer and a connecting line. The base substrate is a transparent substrate, and the plurality of light-emitting units, the protecting layer and the connecting line are laminated in sequence along a direction distal from the base substrate. A via is arranged in the protecting layer, one end of the connecting line is connected to the plurality of light-emitting units through the via, and the other end of the connecting line is configured to connect to a driving circuit of a display apparatus.

20 Claims, 6 Drawing Sheets

(51) Int. Cl.
  *H01L 27/12*  (2006.01)
  *H01L 33/56*  (2010.01)
  *H01L 33/58*  (2010.01)
  *H01L 33/62*  (2010.01)

(56) References Cited

U.S. PATENT DOCUMENTS

| | | | |
|---|---|---|---|
| 2006/0158100 A1* | 7/2006 | Morii | H10K 50/14 |
| | | | 313/506 |
| 2009/0065789 A1 | 3/2009 | Wang et al. | |
| 2009/0278142 A1* | 11/2009 | Watanabe | H01L 24/82 |
| | | | 257/E33.056 |
| 2010/0244059 A1* | 9/2010 | Lida | H01L 24/19 |
| | | | 257/E33.044 |
| 2011/0090689 A1 | 4/2011 | Park | |
| 2013/0001613 A1* | 1/2013 | Hong | H01L 33/647 |
| | | | 257/E33.059 |
| 2014/0085865 A1* | 3/2014 | Yun | G02B 3/0006 |
| | | | 359/619 |
| 2018/0175268 A1* | 6/2018 | Moon | H01L 27/15 |
| 2020/0118988 A1* | 4/2020 | Yueh | H01L 25/167 |
| 2020/0152693 A1 | 5/2020 | Zou et al. | |
| 2021/0264852 A1 | 8/2021 | Gu et al. | |

FOREIGN PATENT DOCUMENTS

| | | | |
|---|---|---|---|
| CN | 108886050 A | 11/2018 | |
| CN | 109920804 A | 6/2019 | |
| CN | 110416242 A | 11/2019 | |
| CN | 210837757 U | 6/2020 | |

\* cited by examiner

DISPLAY SUBSTRATE, SPLICED DISPLAY PANEL AND DISPLAY APPARATUS

CROSS-REFERENCE TO RELATED APPLICATION

This application is a 371 of PCT Application No. PCT/CN2021/070170, filed Jan. 4, 2021, which is based on and claims priority to Chinese Patent Application No. 202020021403.5, filed on Jan. 6, 2020 and titled "DISPLAY SUBSTRATE, SPLICED DISPLAY PANEL AND DISPLAY APPARATUS", the entire content of which is incorporated herein by reference.

TECHNICAL FIELD

The present disclosure relates to the field of display technologies, and more particularly to a display substrate, a spliced display panel and a display apparatus.

BACKGROUND

In the field of display technologies, a spliced display panel is usually adopted for large-area display of images. The spliced display panel is usually formed by a plurality of display substrates which are spliced with each other.

SUMMARY

In one aspect, there is provided a display substrate. The display substrate includes a base substrate, a plurality of light-emitting units, a protecting layer and a connecting line;
   the base substrate is a transparent substrate, and the plurality of light-emitting units, the protecting layer and the connecting line are laminated in sequence along a direction distal from the base substrate; and
   a via is arranged in the protecting layer, one end of the connecting line is connected to the plurality of light-emitting units through the via and the other end of the connecting line is configured to connect to a driving circuit of the display apparatus.

In another aspect, provided is a spliced display panel which includes a parent plate and a plurality of spliced display substrates according to the above-mentioned aspect; and
   the plurality of the display substrates are arranged on the parent plate.

In yet another aspect, provided is a display apparatus which includes a driving circuit, a flexible circuit board and a display substrate according to the above-mentioned aspects;
   both the driving circuit and the flexible circuit board are disposed on a side of a protecting layer in the display substrate distal from a base substrate; and
   the driving circuit is arranged on the flexible circuit board and the driving circuit is connected to a connecting line in the display substrate via the flexible circuit board.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

In the related art, each display substrate includes a connecting line which is arranged on an edge of the display substrate and configured to connect to a flexible circuit board of the display apparatus. Moreover, the display apparatus further includes a driving circuit which is configured to drive the display substrate and is connected to the flexible circuit board.

The present disclosure provides a display substrate, a spliced display panel and a display apparatus, and the technical solutions are given below.

For clearer descriptions of the objects, technical solutions and advantages in the present disclosure, the implementation of the present disclosure is described in detail below in combination with the accompanying drawings.

In the related art, it is necessary to bend a flexible circuit board to arrange a driving IC on the back of a display substrate when a plurality of display substrates are spliced to form a spliced display panel. In this case, the flexible circuit board which connects the display substrate to the driving IC is disposed on a side of the display substrate, which causes a large clearance between every two adjacent display substrates in the spliced display panel and a poor display effect of the spliced display panel.

Figure 1:
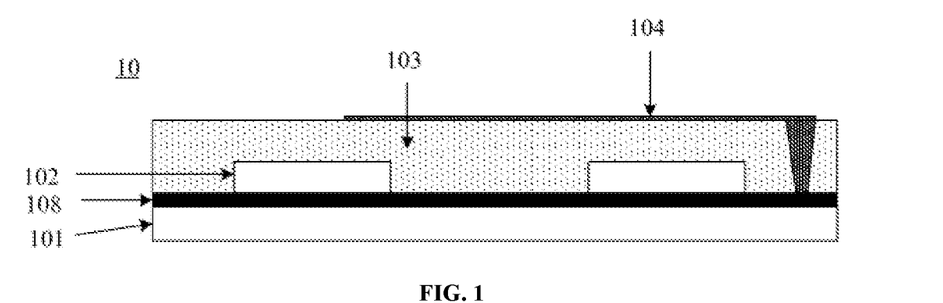
FIG. 1 is a structural diagram of a display substrate according to an embodiment of the present disclosure.

FIG. 1 is a structural diagram of a display substrate according to an embodiment of the present disclosure. With reference to FIG. 1, it can be seen that a display substrate 10 may include a base substrate 101, a plurality of light-emitting units 102, a protecting layer 103 and a connecting line 104. The base substrate 101 may be a transparent substrate, and the plurality of light-emitting units 102, the protecting layer 103 and the connecting line 104 may be laminated in sequence along a direction distal from the base substrate 101.

With reference to FIG. 1, a via may be arranged in the protecting layer 103. One end of the connecting line 104 may be connected to the plurality of light-emitting units 102 through the via and the other end of the connecting line 104 may be configured to connect to a driving circuit.

By arranging the protecting layer 103 between the plurality of light-emitting units 102 and the connecting line 104, the connecting line 104 and the plurality of light-emitting units 102 may be arranged in different layers. Because the connecting line 104 and the plurality of light-emitting units 102 are arranged in different layers and the other end of the connecting line 104 is configured to connect to the driving circuit, the driving circuit is disposed on a side of the protecting layer 103 distal from the base substrate 101. Therefore, it is not necessary to bend a flexible circuit board on a side of a display substrate 10 when a plurality of display substrates 10 are spliced to form a spliced display panel. Moreover, because the base substrate 101 is a transparent substrate, light emitted from the plurality of light-emitting units 102 can be emitted through the base substrate 101. By arranging the driving circuit on a side of the protecting layer 103 distal from the base substrate 101, light emitted from the plurality of light-emitting units 102 may be prevented from being affected by the driving circuit may be avoided so as to ensure a display effect of the display substrate 10.

In summary, the present disclosure provides a display substrate. The display substrate includes a base substrate, and a plurality of light-emitting units, a protecting layer and a connecting line which are laminated in sequence along a direction distal from the base substrate. One end of the connecting line is connected to the plurality of the light-emitting units through a via arranged in the protecting layer while the other end is configured to connect to a driving circuit, that is to say, the driving circuit is arranged directly on a side of the protecting layer distal from the base substrate. Because it is not necessary to bend a flexible circuit board on a side of a display substrate when a plurality of display substrates are spliced to form a spliced display panel, a clearance between every two adjacent display substrates is small and the display effect is good.

Optionally, materials of the protecting layer 103 may include at least one of silica gel and epoxy glue. The protecting layer 103 may be formed on a side of the plurality of light-emitting units 102 distal from the base substrate 101 by a coating process.

In an embodiment of the present disclosure, the plurality of light-emitting units 102 may be disposed in a display area of the display substrate 10. An orthographic projection of the other end of the connecting line 104 on the base substrate 101 is disposed in the display area. With reference to FIG. 1, the orthographic projection of the connecting line 104 on the base substrate 101 may overlap with orthographic projections of some of the plurality of light-emitting units 102 on the base substrate 101.

Because the orthographic projection of the connecting line 104 on the base substrate 101 overlaps with orthographic projections of some of the plurality of light-emitting units 102 on the base substrate 101, an orthographic projection of the driving circuit which connects to the connecting line 104 on the base substrate 101 will also overlap with the orthographic projections of some of the plurality of light-emitting units 102 on the base substrate 101. However, because the driving circuit is disposed on the side of the light-emitting unit 102 distal from the base substrate 101 and light emitted from the light-emitting unit 102 is emitted from the base substrate 101, the driving circuit will not affect the light emitted from the light-emitting unit 102.

Figure 2:
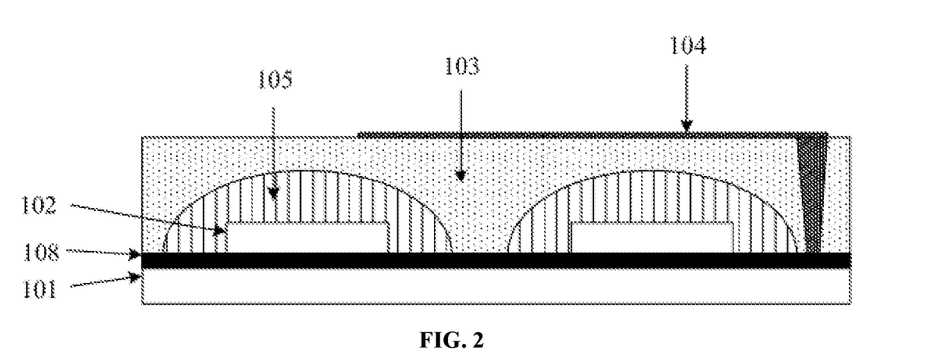
FIG. 2 is a structural diagram of another display substrate according to an embodiment of the present disclosure.

FIG. 2 is a structural diagram of another display substrate according to an embodiment of the present disclosure. With reference to FIG. 2, it can be seen that the display substrate further includes a plurality of micro lenses 105 which are in a one-to-one correspondence with the plurality of light-emitting units. Each micro lens 105 is disposed on a side of a corresponding light-emitting unit 102 distal from the base substrate 101, and the orthographic projection of each light-emitting unit 102 on the base substrate 101 is disposed within an orthographic projection of the corresponding micro lens 105 on the base substrate 101.

The micro lens 105 may be configured to reflect light. Because a part of light emitted from the light-emitting unit 102 may be emitted from the side of the light-emitting unit 102 distal from the base substrate 101, a corresponding micro lens 105 is arranged on the side of each light-emitting unit 102 distal from the base substrate 101 so that some of light emitted from the light-emitting unit 102 irradiates the micro lens 105 and may be reflected to the base substrate 101, thereby improving the light-emitting efficiency of the light-emitting unit 102.

Optionally, materials of the micro lens 105 may include a transparent adhesive. Moreover, a specific dimension of the micro lens 105 may be acquired according to an optical simulation. The micro lens 105 may be formed on the side of the light-emitting unit 102 distal from the base substrate 101 by means of dispensing.

Figure 3:
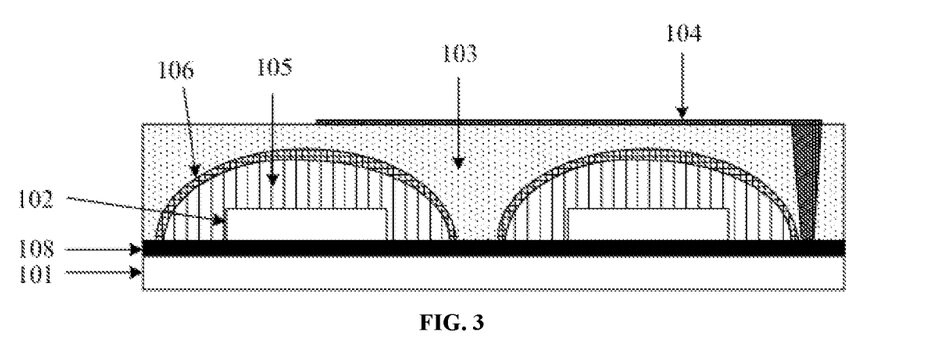
FIG. 3 is a structural diagram of yet another display substrate according to an embodiment of the present disclosure.

FIG. 3 is a structural diagram of yet another display substrate according to an embodiment of the present disclosure. With reference to FIG. 3, the display substrate 10 may further include a plurality of reflective coatings 106 which are in a one-to-one correspondence with the plurality of light-emitting units 102. Each reflective coating 106 is disposed on the side of a corresponding light-emitting unit 102 distal from the base substrate 101, and the orthographic projection of each light-emitting unit 102 on the base substrate 101 is disposed within an orthographic projection of a corresponding reflective coating 106 on the base substrate 101.

In an embodiment of the present disclosure, by arranging a reflective coating 106 on the side of the light-emitting unit 102 distal from the base substrate 101, light emitted from the light-emitting unit 102 can be reflected to the base substrate 101 and so as to be emitted from the base substrate 101, and the light-emitting efficiency of the light-emitting unit 102 is high.

With reference to FIG. 3, it can be seen that the plurality of reflective coatings 106 may be in a one-to-one correspondence with the plurality of micro lenses 105, and each micro lens 105 may be disposed between a light-emitting unit 102 corresponding to the micro lens 105 and a reflective coating 106 corresponding to the micro lens 105. That is to say, the display substrate 10 may include a plurality of micro lenses 105 and a plurality of reflective coatings 106. Each reflective coating 106 may be disposed on a side of a corresponding micro lens 105 distal from the base substrate 101.

By arranging a micro lens 105 and a reflective coating 106 in the display substrate 10, it may be further ensured that light emitted from the light-emitting unit 102 can be reflected to the base substrate 101 and emitted from the base substrate 101, and thus the light-emitting efficiency of the light-emitting unit 102 is high.

With reference to FIG. 3, the orthographic projection of each micro lens 105 on a base substrate 101 is disposed within an orthographic projection of a corresponding reflective coating 106 on the base substrate 101, thus ensuring that light which is not reflected by the micro lens 105 can be reflected by the reflective coating 106, and light emitted from the light-emitting unit 102 can be reflected to the base substrate 101 and emitted from the base substrate 101, and thus the light-emitting efficiency of the light-emitting unit 102 is high.

Optionally, materials of the reflective coating 106 may include at least one of aluminum (Al) and silver (Ag). Certainly, the reflective coating 106 may also be a highly reflective coating made of other highly reflective materials, which is not limited in the embodiments of the present disclosure. Moreover, the reflective coating 106 may be formed on a side of the light-emitting unit distal from the base substrate 101 by an evaporating or a sputtering process.

Figure 4:
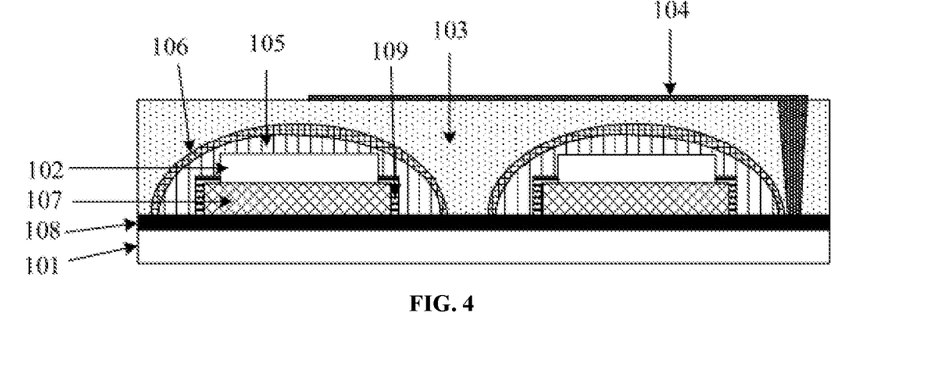
FIG. 4 is a structural diagram of still another display substrate according to an embodiment of the present disclosure.

FIG. 4 is a structural diagram of still another display substrate according to an embodiment of the present disclosure. With reference to FIG. 4, it can be seen that the display substrate may further include a bonding layer 107. The bonding layer 107 may be disposed between the plurality of light-emitting units 102 and the base substrate 101. Each of the plurality of light-emitting units 102 may be bonded on the base substrate 101 via the bonding layer 107.

Optionally, materials of the bonding layer 107 may include a transparent photoresist. Because the bonding layer 107 is made of the transparent photoresist, the bonding layer 107 disposed between the plurality of light-emitting units 102 and the base substrate 101 will affect light emitted from the light-emitting units 102 and the display effect of the display substrate 10 is good when light emitted from the light-emitting units 102 is emitted from the base substrate 101.

With reference to FIG. 4, the orthographic projection of each light-emitting unit 102 on the base substrate 101 may be disposed within an orthographic projection of the bonding layer 107 on the base substrate 101, which ensures that each light-emitting unit 102 can be fixedly arranged on the base substrate 101.

With reference to FIGS. 1 to 4, it should be noted that the display substrate further includes a thin film transistor (TFT) circuit 108 which may be disposed between the base substrate 101 and the plurality of light-emitting units 102. In order to enable the light-emitting unit 102 to work normally, it is required to connect the light-emitting unit 102 to the TFT circuit.

In an embodiment of the present disclosure, each light-emitting unit 102 may be a micro light-emitting diode (micro-LED) or each light-emitting unit 102 may also be an organic light-emitting diode (OLED). The type of the light-emitting unit 102 is not limited in the embodiment of the present disclosure.

Figure 5:
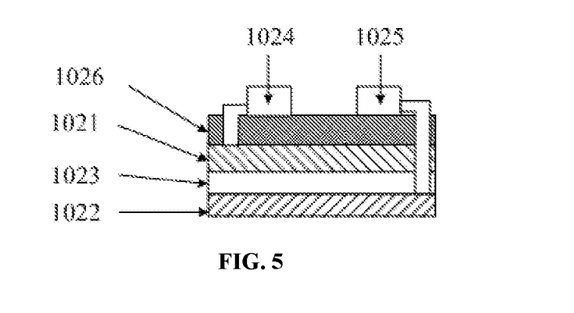
FIG. 5 is a structural diagram of a light-emitting unit according to an embodiment of the present disclosure.

FIG. 5 is a structural diagram of a micro-LED according to an embodiment of the present disclosure. With reference to FIG. 5, it can be seen that the micro-LED includes a first semiconductor layer 1021, a second semiconductor layer 1022, and an active layer 1023 disposed between the first semiconductor layer 1021 and the second semiconductor layer 1022.

Optionally, the first semiconductor layer 1021 may be a P-type semiconductor layer, the active layer 1023 may be a multiple quantum well (MQW) layer, and the second semiconductor layer 1022 may be an N-type semiconductor layer.

Figure 6:
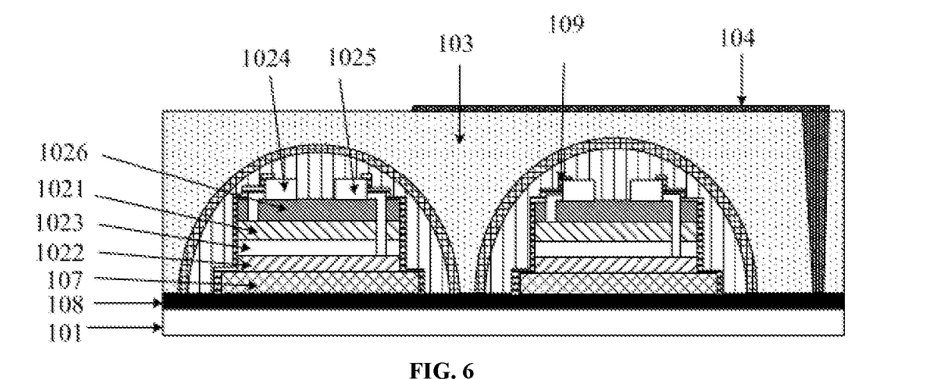
FIG. 6 is a structural diagram of still another display substrate according to an embodiment of the present disclosure.

FIG. 6 is a structural diagram of still another display substrate according to an embodiment of the present disclosure. With reference to FIG. 6, the second semiconductor layer 1022, the active layer 1023 and the first semiconductor layer 1021 are laminated in sequence along a direction distal from the base substrate 101.

In an embodiment of the present disclosure, the micro-LED 102 may further include a first electrode 1024, a second electrode 1025 and a reflective layer 1026, with reference to FIGS. 5 and 6.

The reflective layer 1026 may be disposed on a side of the first semiconductor layer 1021 distal from the active layer 1023. By arranging the reflective layer 1026 in the micro-LED 102, light emitted from the active layer 1023 in the micro-LED 102 may be emitted from the base substrate 101, and a driving circuit which is disposed on a side of the protecting layer 103 distal from the base substrate 101 is avoided from affecting images displayed on the display substrate 10.

Optionally, materials of the reflective layer 1026 may include at least one of aluminum (Al) and silver (Ag). The reflective layer 1026 may be a distributed bragg reflector.

The first electrode 1024 is connected to the first semiconductor layer 1021, and the second electrode 1025 is connected to the second semiconductor layer 1022. The first electrode 1024 may be a P-type electrode, and the second electrode 1025 may be an N-type electrode. Both the first electrode 1024 and the second electrode 1025 may be disposed on a side of the reflective layer 1026 distal from the first semiconductor layer 1021.

Both the first electrode 1024 and the second electrode 1025 may be connected to the TFT circuit. Both the first electrode 1024 and the second electrode 1025 may be connected to different TFT circuits.

In summary, the present disclosure provides a display substrate. The display substrate includes a base substrate, and a plurality of light-emitting units, a protecting layer and a connecting line which are laminated in sequence along a direction distal from the base substrate. One end of the connecting line is connected to the plurality of the light-emitting units through a via arranged in the protecting layer while the other end is configured to connect to a driving circuit, that is to say, the driving circuit may be arranged directly on a side of the protecting layer distal from the base substrate. Because it is not necessary to bend a flexible circuit board on a side of a display substrate when a plurality of display substrates are spliced to form a spliced display panel, a clearance between every two adjacent display substrates is small and the display effect is good.

Figure 7:
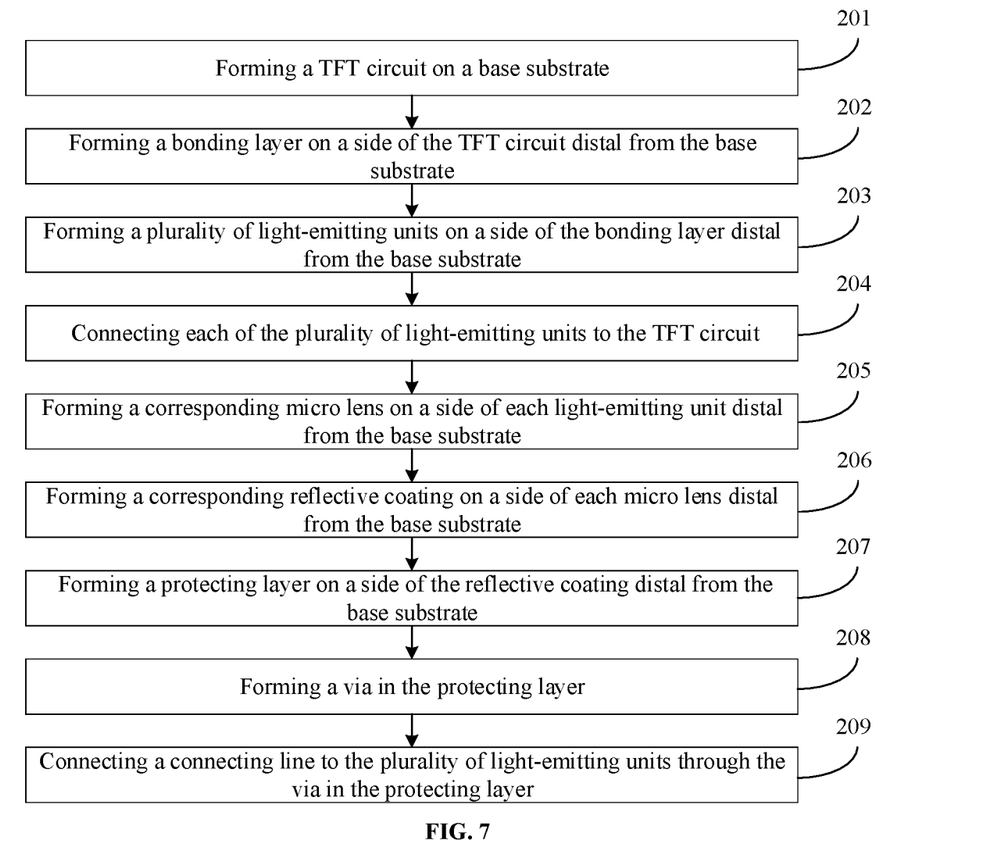
FIG. 7 is a flow chart of a method for manufacturing a display substrate according to an embodiment of the present disclosure.

FIG. 7 is a flow chart of a method for manufacturing a display substrate according to an embodiment of the present disclosure. The method may be configured to manufacture the display substrate 10 according to the aforementioned embodiments. With reference to FIG. 7, it can be seen that the method may include the following steps.

Figure 8:
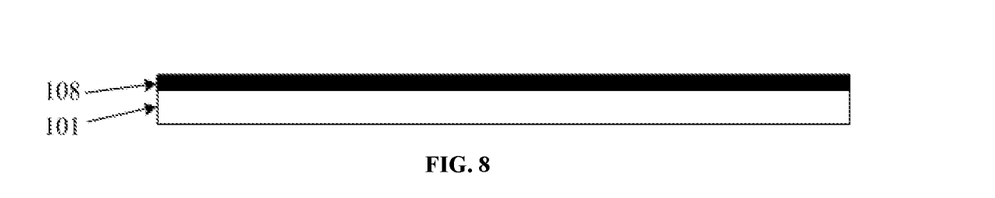
FIG. 8 is a structural diagram of forming a TFT circuit on a side of a base substrate according to an embodiment of the present disclosure.

In step 201, a TFT circuit is formed on a base substrate.

With reference to FIG. 8, the TFT circuit may be formed on a side of the base substrate 101.

Figure 9:
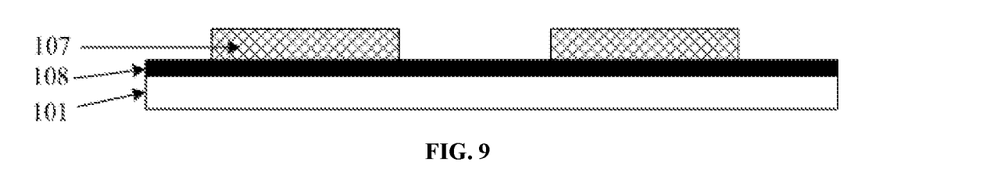
FIG. 9 is a schematic diagram of forming a bonding layer on a side of a TFT circuit distal from a base substrate according to an embodiment of the present disclosure.

In step 202, a bonding layer is formed on a side of the TFT circuit distal from the base substrate.

With reference to FIG. 9, the bonding layer 107 may be disposed on the side of the base substrate 101. Material of the bonding layer 107 may be a transparent photoresist.

Figure 10:
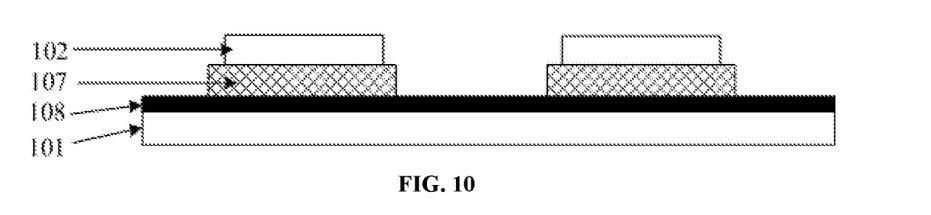
FIG. 10 is a schematic diagram of forming a plurality of light-emitting units on a side of a bonding layer distal from a base substrate according to an embodiment of the present disclosure.

In step 203, a plurality of light-emitting units are formed on a side of the bonding layer distal from the base substrate.

With reference to FIG. 10, the plurality of light-emitting units 102 may be disposed on the side of the bonding layer 107 distal from the base substrate 101, and the plurality of light-emitting units 102 may be bonded on the base substrate 101 via the bonding layer 107.

Optionally, a mass transfer technology may be adopted in an embodiment of the present disclosure to transfer the plurality of light-emitting units 102 to the base substrate 101 on which a TFT circuit is formed.

Figure 11:
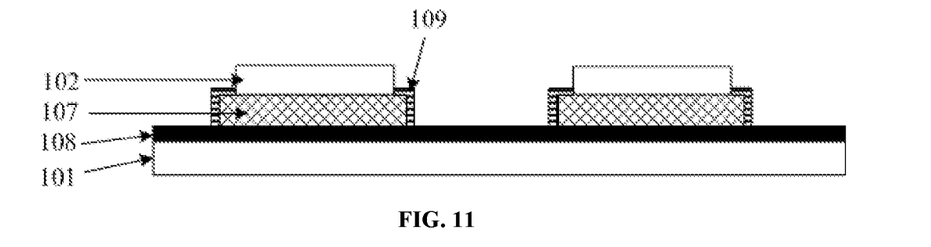
FIG. 11 is a structural diagram showing a plurality of light-emitting units to a TFT circuit are connected according to an embodiment of the present disclosure.

In step 204, each of the plurality of light-emitting units is connected to the TFT circuit.

With reference to FIG. 11, a connecting line 109 may be formed on the side of the base substrate 101 and each light-emitting unit 102 is connected to the TFT circuit via the connecting line 109 in order to ensure that the light-emitting unit can work normally.

Figure 12:
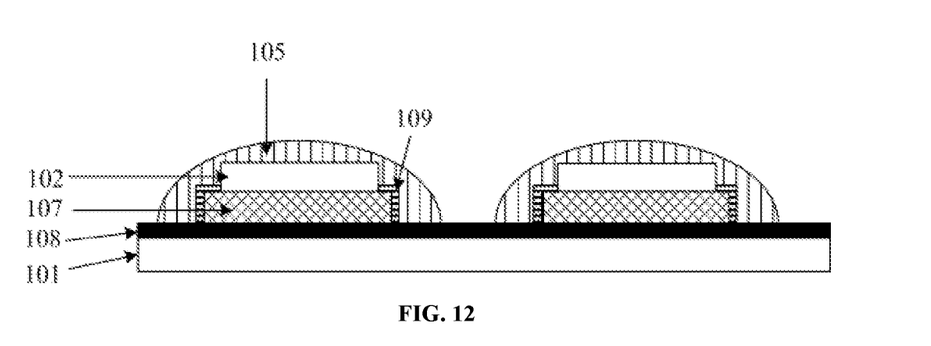
FIG. 12 is a schematic diagram of a micro lens formed on a side of the plurality of light-emitting units distal from the base substrate according to an embodiment of the present disclosure.

In step 205, a corresponding micro lens is formed on a side of each light-emitting unit distal from the base substrate.

With reference to FIG. 12, a corresponding micro lens 105 may be formed on the side of each light-emitting unit 102 distal from the base substrate 101 by means of dispensing. Materials of the micro lens 105 may include a transparent adhesive.

Figure 13:
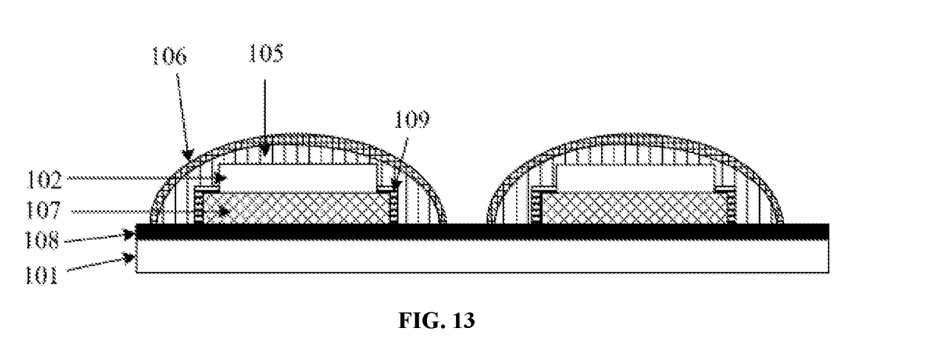
FIG. 13 is a schematic diagram of a reflective coating formed on a side of the micro lens distal from the base substrate according to an embodiment of the present disclosure.

In step 206, a corresponding reflective coating is formed on a side of each micro lens distal from the base substrate.

With reference to FIG. 13, a reflective coating 106 may be formed on the side of the micro lens 105 distal from the base substrate 101 by an evaporating or a sputtering process. Materials of the reflective coating 106 may include at least one of aluminum and silver.

Figure 14:
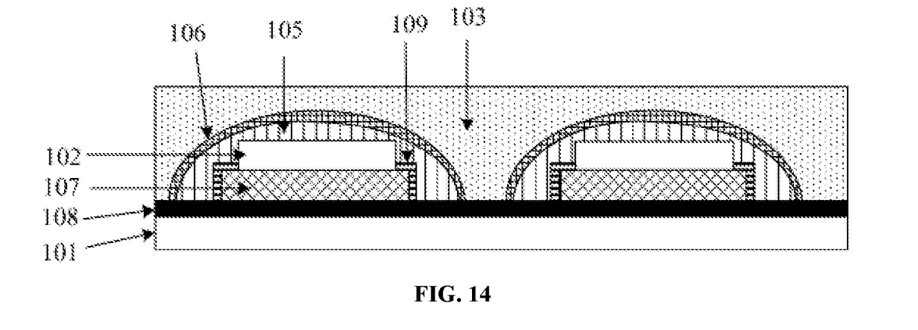
FIG. 14 is a schematic diagram of a protecting layer formed on a side of the reflective coating distal from the base substrate according to an embodiment of the present disclosure.

In step 207, a protecting layer is formed on a side of the reflective coating distal from the base substrate.

With reference to FIG. 14, the protecting layer 103 may be formed on the side of the reflective coating 106 distal from the base substrate 101 by a coating process. Materials of the protecting layer 103 may include at least one of silica gel and epoxy glue.

Figure 15:
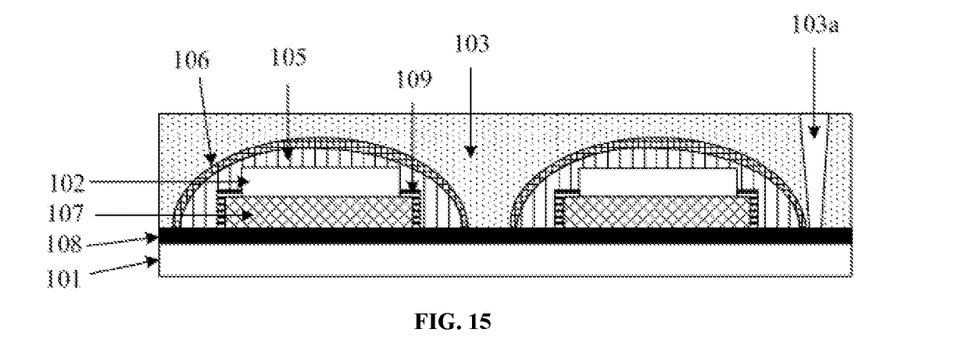
FIG. 15 is a structural diagram of a via formed on the protecting layer according to an embodiment of the present disclosure.

In step 208, a via is formed in the protecting layer.

In an embodiment of the present disclosure, a via 103a may be formed in a protecting layer 103 after the protecting layer 103 is formed so that a plurality of light-emitting units 102 can be connected to a driving circuit, with reference to FIG. 15.

In step 209, the connecting line is connected to the plurality of light-emitting units through the via in the protecting layer.

With reference to FIG. 4, the connecting line 104 may be arranged in the via formed in the protecting layer 103 and connected to the plurality of light-emitting units 102 through the via. That is to say, one end of the connecting line 104 may be connected to the plurality of light-emitting units 102 and the other end may be configured to connect to a driving circuit.

It should be noted that the sequence of steps for the method of manufacturing the display substrate according to the embodiments of the present disclosure may be adjusted appropriately, and the steps may also be deleted or added according to the situation. For example, steps 204 to 206 may be deleted according to the actual situation, and step 207 may be that a protecting layer is formed on a side of the plurality of light-emitting units distal from the base substrate. Within the technical scope disclosed in the present disclosure, any variations of the method easily derived by a person of ordinary skill in the art shall fall within the protection scope of the present disclosure, which is not repeated here.

In summary, the embodiment of the present disclosure provides a method for manufacturing a display substrate. Due to the connecting line, the manufactured display substrate is connected to the light-emitting unit through a via arranged in the protecting layer. The connecting line and the light-emitting unit are arranged in different layers, therefore a driving circuit connected to the connecting line may be arranged directly on a side of the protecting layer distal from the base substrate and it is not necessary to bend a flexible circuit board on a side of the display substrate. When a plurality of display substrates are spliced to form a spliced display panel, a clearance between every two adjacent display substrates may be small, and the display effect may be good.

Figure 16:
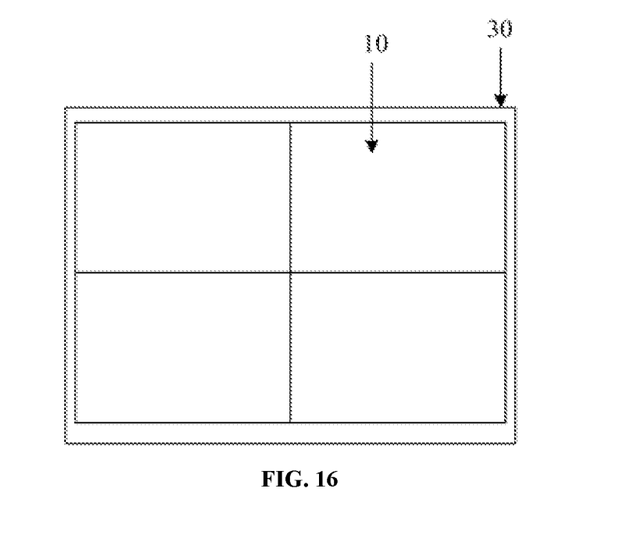
FIG. 16 is a structural diagram of a spliced display panel according to an embodiment of the present disclosure.

FIG. 16 is a structural diagram of a spliced display panel according to an embodiment of the present disclosure. With reference to FIG. 16, it can be seen that the spliced display panel may include a parent plate 30 and a plurality of spliced display substrates 10 according to the embodiments described above. For example, the spliced display panel shown in FIG. 16 includes four spliced display substrates 10.

The plurality of display substrates 10 may be arranged on the parent plate 30. The parent plate 30 may be configured to fix the plurality of display substrates 10 and no connection is required among the plurality of display substrates 10.

Figure 17:
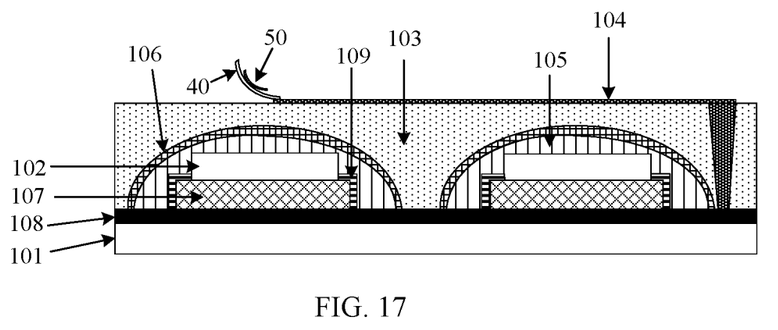
FIG. 17 is a structural diagram of a display apparatus according to an embodiment of the present disclosure.

FIG. 17 is a structural diagram of a display apparatus according to an embodiment of the present disclosure. With reference to FIG. 17, it can be seen that the display apparatus may include a driving circuit 50, a flexible circuit board 40 and display substrates 10 according to the embodiments described above. The flexible circuit board 40 may be disposed on a side of the protecting layer 103 in the display substrate 10 distal from the base substrate 101, and the driving circuit 50 may be arranged on the flexible circuit board 40. The driving circuit 50 may be connected to a connecting line 104 in the display substrate 10 via the flexible circuit board 40.

Because light emitted from a plurality of light-emitting units 102 in the display substrate 10 is emitted from the base substrate 101 in the display substrate 10 and that the driving circuit and the flexible circuit board 40 are disposed on a side of the protecting layer 103 distal from the base substrate 101, light emitted from the light-emitting units 102 will not be influenced by the driving circuit and the flexible circuit board 40. Moreover, the driving circuit is connected to a connecting line 104 via the flexible circuit board 40, which improves the reliability of the connection between the driving circuit and the connecting line 104.

In an embodiment of the present disclosure, the display apparatus may further include a parent plate 30 and a plurality of display substrates 10. The plurality of the display substrates 10 may be arranged on the parent plate 30. That is to say, the display apparatus may include the spliced display panel according to the embodiments described above.

In an embodiment of the present disclosure, the display apparatus may be any product or component with a display function, such as an LCD panel, an electronic paper, an OLED panel, a mobile phone, a tablet computer, a television, a display, a notebook computer, a digital photo frame or a navigator.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display substrate comprising a base substrate, a plurality of light-emitting units, a protecting layer and a connecting line, wherein
   the base substrate is a transparent substrate, and the plurality of light-emitting units are at the base substrate, the protecting layer is at a side, which is distal from the base substrate, of the plurality of light-emitting units, and the connecting line is at a side, which is distal from the plurality of light-emitting units, of the protecting layer; and
   a via is arranged in the protecting layer, one end of the connecting line is connected to the plurality of light-emitting units through the via, and the other end of the connecting line is configured to connect to a driving circuit of a display apparatus.

2. The display substrate according to claim 1, wherein the plurality of light-emitting units are disposed in a display area of the display substrate; and
   an orthographic projection of the other end of the connecting line on the base substrate is disposed in the display area; and
   wherein the orthographic projection of the connecting line on the base substrate overlaps with orthographic projections of some of the plurality of light-emitting units on the base substrate.

3. The display substrate according to claim 1, wherein the display substrate further comprises a plurality of micro lenses which are in a one-to-one correspondence with the plurality of light-emitting units; and
   each of the plurality of micro lenses is disposed on a side of a corresponding light-emitting unit distal from the base substrate, and the orthographic projection of each of the plurality of light-emitting units on the base substrate is disposed within an orthographic projection of a corresponding micro lens on the base substrate.

4. The display substrate according to claim 3, wherein materials of the plurality of micro lenses comprise a transparent adhesive.

5. The display substrate according to claim 1, wherein the display substrate further comprises a plurality of reflective coatings which are in a one-to-one correspondence with the plurality of light-emitting units; and
   each of the plurality of reflective coatings is disposed on a side of a corresponding light-emitting unit distal from the base substrate, and the orthographic projection of each of the plurality of light-emitting units on the base substrate is disposed within an orthographic projection of a corresponding reflective coating on the base substrate.

6. The display substrate according to claim 5, wherein the plurality of reflective coatings are in a one-to-one correspondence with the plurality of micro lenses in the display substrate; and
   each of the plurality of micro lenses is disposed between the corresponding light-emitting unit and the corresponding reflective coating.

7. The display substrate according to claim 6, wherein an orthographic projection of each of the plurality of micro lenses on the base substrate is disposed within the orthographic projection of the corresponding reflective coating on the base substrate.

8. The display substrate according to claim 5, wherein materials of the plurality of reflective coatings comprise at least one of aluminum and silver.

9. The display substrate according to claim 1, wherein the display substrate further comprises a bonding layer; and
   the bonding layer is disposed between the plurality of light-emitting units and the base substrate and the plurality of light-emitting units are bonded on the base substrate via the bonding layer.

10. The display substrate according to claim 9, wherein material of the bonding layer is a transparent photoresist.

11. The display substrate according to claim 1, wherein the display substrate further comprises a thin film transistor circuit which is disposed between the base substrate and the plurality of light-emitting units; and
    each of the plurality of light-emitting units is connected to the thin film transistor circuit.

12. The display substrate according to claim 1, wherein material of the protecting layer comprises at least one of silica gel and epoxy glue.

13. The display substrate according to claim 1, wherein each of the plurality of light-emitting units is a micro light-emitting diode.

14. The display substrate according to claim 13, wherein the micro light-emitting diode comprises a first semiconductor layer, a second semiconductor layer, and an active layer disposed between the first semiconductor layer and the second semiconductor layer.

15. The display substrate according to claim 14, wherein the second semiconductor layer, the active layer and the first semiconductor layer are laminated in sequence along the direction distal from the base substrate; the micro light-emitting diode further comprises a first electrode, a second electrode and a reflective layer;
    the reflective layer is disposed on a side of the first semiconductor layer distal from the active layer; and
    the first electrode is connected to the first semiconductor layer, the second electrode is connected to the second semiconductor layer, and both the first electrode and the second electrode are disposed on a side of the reflective layer distal from the first semiconductor layer.

16. The display substrate according to claim 15, wherein the first semiconductor layer is a P-type semiconductor layer, the active layer is a multiple quantum well layer, and the second semiconductor layer is an N-type semiconductor layer.

17. The display substrate according to claim 1, wherein light emitted from the plurality of light-emitting units is emitted through the base substrate.

18. A spliced display panel, comprising a parent plate and a plurality of spliced display substrates, wherein,
    the display substrates are the display substrates according to claim 1; and the plurality of the display substrates are arranged on the parent plate.

19. A display apparatus, wherein the display apparatus comprises a driving circuit, a flexible circuit board and the display substrate according to claim 1;

both the driving circuit and the flexible circuit board are disposed on a side of the protecting layer in the display substrate distal from a base substrate; and the driving circuit is arranged on the flexible circuit board and the driving circuit is connected to the connecting line in the display substrate via the flexible circuit board.

20. The display apparatus according to claim 19, wherein the display apparatus comprises a parent plate and a plurality of spliced display substrates; and the plurality of the display substrates are arranged on the parent plate.

\* \* \* \* \*

UNITED STATES PATENT AND TRADEMARK OFFICE
CERTIFICATE OF CORRECTION

PATENT NO. : 12,095,011 B2
APPLICATION NO. : 17/434712
DATED : September 17, 2024
INVENTOR(S) : Enkai Dong

Page 1 of 1

It is certified that error appears in the above-identified patent and that said Letters Patent is hereby corrected as shown below:

On the Title Page

Item (73) should read:
(73) Assignees: BOE MLED Technology Co., Ltd., Beijing (CN); BOE Technology Group Co., Ltd., Beijing (CN)

Signed and Sealed this
Twenty-ninth Day of July, 2025

Coke Morgan Stewart
*Acting Director of the United States Patent and Trademark Office*